United States Patent [19]

Marrs et al.

[11] Patent Number: 5,483,100

[45] Date of Patent: Jan. 9, 1996

[54] INTEGRATED CIRCUIT PACKAGE WITH VIA INTERCONNECTIONS FORMED IN A SUBSTRATE

[75] Inventors: Robert C. Marrs, Scottsdale, Ariz.; Tadashi Hirakawa, Osaka, Japan

[73] Assignees: Amkor Electronics, Inc., Chandler, Ariz.; Teijin Limited, Osaka, Japan

[21] Appl. No.: 893,518

[22] Filed: Jun. 2, 1992

[51] Int. Cl.⁶ .................. H01L 23/053; H01L 23/12; H01L 23/495

[52] U.S. Cl. .................. 257/700; 257/666; 361/761

[58] Field of Search .................. 257/774, 758, 257/750, 792, 784, 700, 692, 786; 361/748, 736, 772

[56] References Cited

U.S. PATENT DOCUMENTS

| | | | |
|---|---|---|---|
| 3,335,489 | 8/1967 | Grant | 257/774 |
| 3,560,257 | 2/1971 | Schneble, Jr. et al | 257/774 |
| 3,777,221 | 12/1973 | Tatusko et al. | 257/774 |
| 3,959,579 | 5/1976 | Johnson | 257/774 |
| 4,225,900 | 9/1980 | Ciccio et al. | 257/774 |
| 4,473,737 | 9/1984 | Anthony | 219/121 LL |
| 4,479,991 | 10/1984 | Thompson | 361/748 |
| 4,508,749 | 4/1985 | Brannon et al. | 427/43.1 |
| 4,745,258 | 5/1988 | Arima | 219/121 LG |
| 4,754,317 | 6/1988 | Comstock et al. | 357/70 |
| 4,798,931 | 1/1989 | Hess, III | 219/121.64 |
| 4,839,497 | 6/1989 | Sankar et al. | 219/121.71 |
| 4,908,933 | 3/1990 | Sagisaka et al. | 29/827 |
| 4,914,269 | 4/1990 | Kinsman et al. | 219/121.64 |
| 4,915,981 | 4/1990 | Traskos et al. | 427/53.1 |
| 4,931,134 | 6/1990 | Hatkevitz et al. | 156/630 |
| 4,948,941 | 8/1990 | Altman et al. | 219/121.71 |
| 4,963,697 | 10/1990 | Peterson et al. | 361/792 |
| 4,975,761 | 12/1990 | Chu | 357/72 |
| 4,995,941 | 2/1991 | Nelson et al. | 156/630 |
| 5,010,232 | 4/1991 | Arai et al. | 219/121.7 |
| 5,055,914 | 10/1991 | Shimizu et al. | 257/774 |
| 5,220,491 | 6/1993 | Sugano et al. | 361/784 |

FOREIGN PATENT DOCUMENTS

| | | | |
|---|---|---|---|
| 476589 | 3/1992 | European Pat. Off. | 257/700 |
| 60-194545 | 10/1985 | Japan | 257/700 |
| 1281791 | 5/1988 | Japan . | |
| 01155633 | 6/1989 | Japan | 257/786 |
| 02044741 | 2/1990 | Japan | 257/692 |
| 04159764 | 6/1992 | Japan | 257/774 |

OTHER PUBLICATIONS

IBM, TDB vol. 17, No. 7, Dec. 1974 Personalizing Pre-packaged Semiconductor Devices, Chang et al. pp. 1950–1951.

Primary Examiner—Rolf Hille
Assistant Examiner—T. M. Arroyo
Attorney, Agent, or Firm—Skjerven, Morrill, MacPherson, Franklin & Friel

[57] ABSTRACT

An integrated circuit package, and a method for forming the integrated circuit package, including a single layer or multilayer substrate in which interconnection vias are formed is described. Laser energy is swept across a surface of a mask in which holes have been formed. Laser energy passing through the holes of the mask forms vias in a substrate held in place below the mask. The laser energy is swept at such a speed and is maintained at such an energy level that the laser energy forms vias in the substrate, but does not penetrate a set of leads attached to the substrate. Vias may be formed in this way by either a mask imaging, contact mask or conformal mask technique. The laser energy is emitted from a non-thermal (e.g., excimer) laser. The substrate is formed of an organic (e.g., epoxy) resin. The resin may include reinforcing fibers (e.g., aramid fibers). Substrates may be formed on one or both sides of the set of leads. After formation in the substrate, the vias are coated with an electrically conductive material. The method of via formation is fast, inexpensive, achieves higher via density, and avoids overheating of the substrate.

11 Claims, 7 Drawing Sheets

INTEGRATED CIRCUIT PACKAGE WITH VIA INTERCONNECTIONS FORMED IN A SUBSTRATE

BACKGROUND OF THE INVENTION

1. Field of the Invention

This invention relates to electronic devices such as integrated circuit devices, hybrid circuits and multichip integrated circuit modules, and, in particular, to the electrical connection of integrated circuits to other integrated circuits, conductive components and conductive leads within a single package. Most specifically, the invention relates to electronic device packages which include a single layer or multilayer substrate in which vias are used to interconnect the substrate to package leads or interconnect layers within the substrate, and to a method for forming such packages.

2. Related Art

An integrated circuit is formed on a semiconductor die. Usually, the die is enclosed in a package. Typically, electrical connection to components (i.e., active components such as integrated circuits, transistors and diodes, and passive components such as resistors, capacitors and inductors) outside an integrated circuit package is made via individual leads (originally part of a leadframe) extending from the package. The leads are electrically connected to the integrated circuit on the die inside the package. Historically, this electrical connection has been made by affixing bond wires between an inner portion of selected leads and bond pads on the die.

This type of electrical connection between the leads and the integrated circuit within the package was designed for use with packages containing a single semiconductor die. The development of multichip integrated circuit packages, where a plurality of semiconductor die are mounted on an electrically insulative surface (interconnection substrate) and enclosed in a package, necessitated a more ellaborate approach. The integrated circuits in a multichip package are typically connected to traces (conductive off-chip interconnecting paths) on the electrically insulative surface using either wire bonding technology, tape automated bonding (TAB), or flip chip technology. Electrical connection is then made between the traces on the interconnection substrate and the leads of the package by affixing bond wires between selected leads and bond pads located on the periphery of the interconnection substrate. An example of such a method is shown in U.S. Pat. No. 4,754,317 to Comstock et al.

As the complexity of integrated circuits grew, multilayer substrates were developed to improve performance and make routing easier between components. Each layer of a multilayer substrate typically comprises dielectric and conductive material. An example of such a substrate is shown in U.S. Pat. No. 4,975,761 to Chu. The additional layers allow the crossing of traces so that circuit components (i.e., active components such as integrated circuits, transistors and diodes, and passive components such as resistors, capacitors and inductors) can be placed and interconnected closer together (i.e., circuit density is increased) than would be the case if these components were mounted on a single metal layer substrate, or individually packaged and mounted to a printed circuit board.

Eventually, the density of leads for a given substrate was increased by interconnecting leads to the substrate with a copper plated "through hole" (a mechanically drilled hole extending through all layers of the substrate and leads). An example of such a method is shown in U.S. Pat. No. 4,908,933 to Sagisaka et al. However, this method became impractical as the need for higher density increased since the process of drilling through holes cannot provide the close spacing needed. Further, the space opposite to the interconnect side of the substrate is unable to be utilized because the electrical connection within the hole extends through all layers.

Forming through holes by mechanical drilling has limitations. Through holes smaller than a certain size cannot be formed because of limitations on the size of the drill bits used to form the through holes. As the bits get smaller and smaller, they are increasingly likely to break during drilling, making mechanical drilling impractical for very small through holes. Further, the spacing between through holes is limited. If the spacing is too small, the material lying between an existing through hole and one being drilled will deform due to the forces imparted by the drilling process. For these reasons, the density of through holes (and thus electrical interconnections) is limited. In a one square inch substrate in which through holes have been formed in staggered rows by mechanical drilling, the number of leads (i.e., vias) is typically limited to approximately 256.

Additionally, the speed of through hole formation is limited when mechanical drilling is used. Through holes can only be drilled one at a time. If it is attempted to increase the speed of through hole formation by increasing the speed with which the drilling motion is repeated, the likelihood of breaking drill bits increases.

In response to these problems, a new technique was developed in which vias (small concave depressions in insulative material which connect a first conductive region to a second conductive region) are formed in the substrate at locations at which it is desired to make electrical interconnection between the leads and the substrate. Vias can also be formed in the substrate at locations at which it is desired to make interconnection between electrically conductive portions of various layers of the multilayer substrate. After forming the vias, electrically conductive material is deposited to connect the interior of each via or through hole to the inner portion of one of the leads or to an electrically conductive portion of a substrate layer.

Lasers may be used to form vias spaced more closely together so that greater via density is achieved than possible with mechanical drilling of through holes. Thermal lasers, such as $CO_2$ lasers or Nd:YAG lasers, have been used to form vias in inorganic substrates. Thermal lasers emit laser energy that penetrates a material by heating the material to produce melting and evaporation.

Preferably, organic material is used to form the dielectric layers of multilayered substrates because of the lower cost, superior dielectric properties and ease of penetration of organic material. However, the use of a thermal laser in forming vias in organic materials produces undesirable side effects due to the heating of the material. These side effects include, but are not limited to, dielectric degradation, charring and surface reflow.

Further, prior use of lasers to form vias has been implicitly limited by the mechanical drilling model in that vias have been formed one at a time by a laser beam directed at the substrate. This approach is unnecessarily slow because it requires repositioning of the laser before forming each via, and each via must be completely formed before another is begun.

Therefore, there is a need for a method of forming vias in a single layer or multilayer substrate that is fast, achieves high via density, and does not overheat the substrate or cause other quality or reliability problems during formation of the vias. There is also a need for an integrated circuit package including a single layer or multilayer substrate in which vias are formed to achieve high interconnection density between electrical components within the package and between electrical components and the package leads.

SUMMARY OF THE INVENTION

In accordance with the invention, there is provided an integrated circuit package including a single layer or multilayer substrate in which vias are formed to interconnect electrically conductive components in the substrate to the electrically conductive package leads so that high electrical interconnect density is achieved.

The vias are formed by a method according to the invention. Focused laser energy is swept across one surface of a mask in which holes have been formed. As the laser energy is swept:, laser energy passes through the holes of the mask. The laser energy passing through the holes strikes the surface of a substrate held in place below the mask. The laser energy penetrates the substrate to form vias. A set of leads is preferably laminated into an interior region of the substrate or attached to a side of the substrate opposite the side which is struck by the laser energy. The sheet of laser energy is swept at such a speed and is maintained at such an energy level that the laser energy forms vias in the substrate, but does not penetrate the leads.

In accordance with the invention, the mask may be disposed relative to the substrate in any of a number of ways. In one method according to the invention, the mask is held in place above the surface of the substrate which is to be contacted by the laser energy. In another method according to the invention, the mask is held by mechanical pressure to the surface of the substrate which is to be penetrated by the laser energy. In yet another embodiment according to the invention, the mask is formed integrally with the substrate. In this method, again the mask contacts the surface of the substrate which is to be penetrated by the laser energy. However, the mask is not held in place by mechanical pressure, but rather is attached to the surface of the substrate. In this method according to the invention, the mask is preferably left on the substrate surface after via formation so that the mask may be subject to further processing.

Additionally, other methods of via formation could be used to make an integrated circuit package according to the invention which includes a single layer or multilayer substrate in which interconnecting vias are formed. These methods include etching or chemical milling, as well as pre-drilling of vias prior to lamination of the substrate to the package leads.

The method according to the invention may be used to form interconnections between the outer surface of the substrate and the leads, inner metal surfaces of the substrate and the leads, and two conductive surfaces of the substrate. The method according to the invention may be used to form vias with circular or elongated cross-sectional shapes. The elongated cross-sectional shape has the advantage of allowing interconnection density to be increased without adversely affecting the reliability of the electric interconnections. Slightly oversized vias may also be formed according to the invention to allow interconnection of package leads and inner metal layers with one via rather than two. The method according to the invention may also be used to form cavities in the substrate in which integrated circuit devices may be disposed.

Further in accordance with the invention, the substrate in one embodiment is formed of an organic resin and the laser energy is emitted from a non-thermal laser. The non-thermal laser is preferably an excimer laser. The organic resin is preferably either a thermosetting or a thermoplastic resin. Of the thermosetting resins, epoxy resin, polyimide resin, polyamide resin, polyetherimide resin or polycyanurate resin may be used. Of the thermoplastic resins, polyester resin, polyamide resin, polysulfone resin, polyetherimide resin or polycarbonate resin may be used. Epoxy resin is preferred. The resin may also include reinforcing fibers. The fibers may be organic (e.g., aramid, polyester, polyamide, poly-ether-ether-ketone, polyimide, polyetherimide or polysulfone) or they may be inorganic (e.g., alumina, silica) if the inorganic fibers do not greatly impede the laser penetration.

In accordance with the invention, substrates may be formed on one or both sides of the set of leads. If substrates are formed on both sides of the leads, a single laser may be used to form the vias (via formation taking place through first one substrate and then the other) or two lasers may be used to form the vias (in which case the vias may be formed through the substrates simultaneously).

Once vias are formed in the substrate or substrates, the vias are coated with an electrically conductive material (by electroplating copper, electroless copper plating, or screening and filling vias with conductive material) so that electrical connection is established between particular leads and locations on or within each substrate at which it is desired to make electrical contact. Coating a via with electrically conductive material may also be done to establish contact between two or more electrical contact points which are all disposed within or on the substrate.

The method according to the invention is faster than prior methods because many vias may be formed simultaneously in the substrate. Further, high via density is achieved because of the ability to form holes smaller and closer together than possible with mechanical drills. Additionally, overheating of the substrate during via formation is avoided since a non-thermal laser is preferably used. Last, the method according to the invention is inexpensive because of the fast via formation and elimination of the need to clean out extraneous material that would be left in the vias if they were formed by a thermal laser.

Lead and substrate combinations formed with organic material according to the invention are even more inexpensive to produce than if inorganic material is used because of the low cost of organic materials relative to inorganic materials and the greater ease with which the organic materials may be penetrated. Lead and substrate combinations with substrates formed on both sides of the leads achieve even greater via density than combinations formed with a substrate on only one side.

DETAILED DESCRIPTION OF THE PREFERRED EMBODIMENTS

Figure 1:
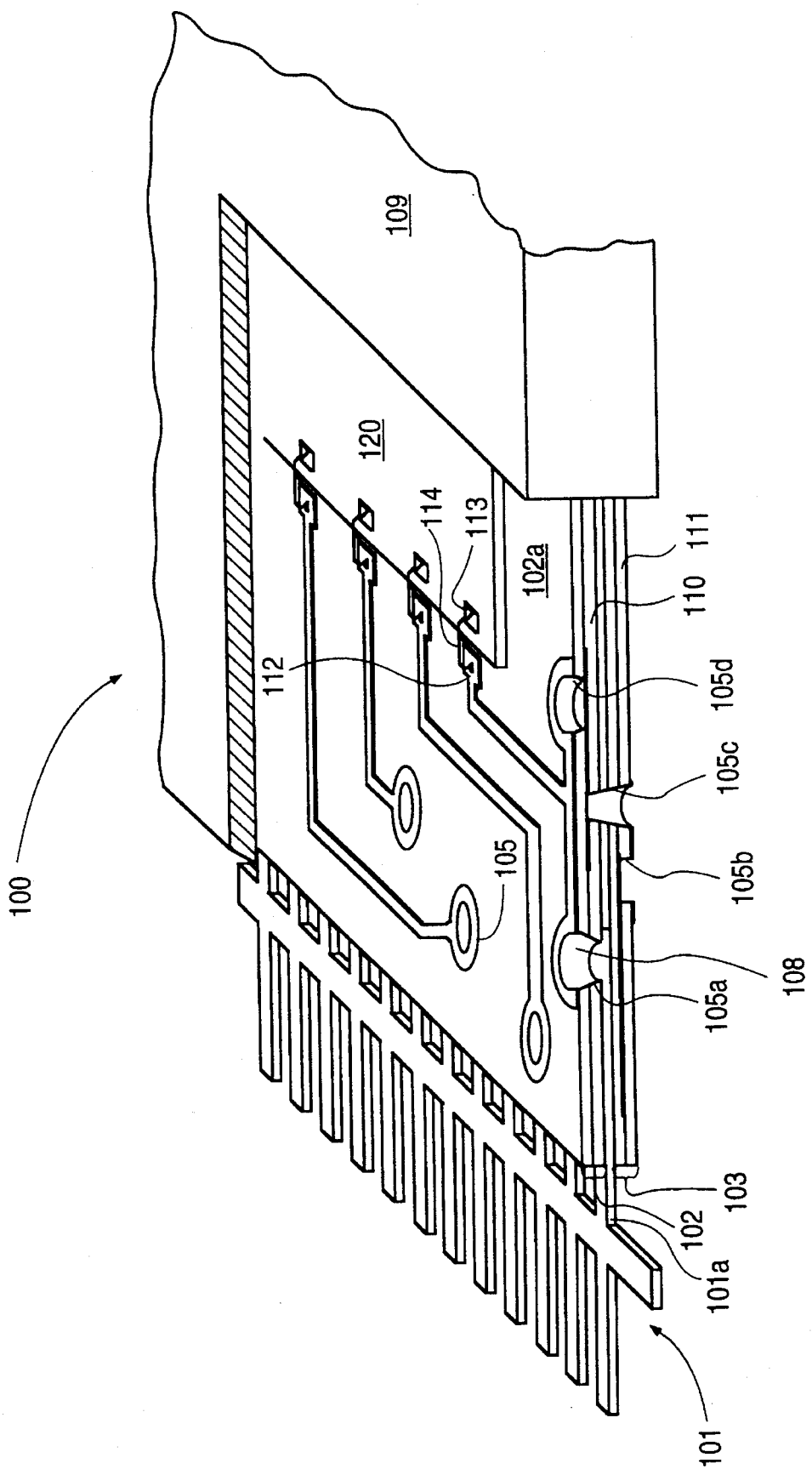
FIG. 1 is a cutaway view of a section of a lead and multilayer substrate combination in which vias are formed to connect the multilayered substrate to the leads, connect the leads to an inner layer of the substrate, and connect two inner layers of the substrate.

FIG. 1 is a cutaway view of a section of a lead and multilayer substrate combination 100 in which vias 105 are formed to connect the multilayered substrates 102, 103 to the leads 101, connect the leads 101 to an inner layer 110 of the substrate 102, and connect two inner layers 110, 111 of the substrates 102, 103. Vias 105 are formed by a method according to the invention to, for instance, electrically connect leads 101 to traces 107 that extend along an outer surface, e.g., surface 102a, of the substrate 102 from vias 105 to integrated circuit connection areas 112. An integrated circuit 120 is connected by bond wires 114 from bond pads 113 to connection areas 112 so that electrical connection can be made from the integrated circuit 120 to the exterior of the package through the leads 101. An encapsulant 109 encases the substrates 102, 103, integrated circuit 120, bond wires 114, and an inner portion of leads 101.

Though the combination 100 shown has substrates 102, 103 attached on opposite sides of the set of leads 101, and the substrates 102, 103 have multiple layers, e.g., layers 110, 111, it is to be understood that the invention encompasses lead and substrate combinations in which a substrate is formed on only one side of the set of leads 101 and/or the substrate(s) has only one layer, e.g., layer 110.

Each layer, e.g., layer 110 of the multilayered substrates 102, 103 is comprised of a layer of dielectric material and a generally conductive layer which includes conductive paths and/or electronic interconnections. As shown in FIG. 1, vias such as via 105 can be formed through one or more of the layers, e.g., layer 110, of each substrate 102, 103 to, but not through, the set of leads 101, so that via 105 intersects a location on one of the conductive layers at which it is desired to make electrical connection to a lead 101.

Via 105a is used to connect an electrically conductive trace 107 to a lead 101a. Vias 105b, 105c, 105d are used to connect electrically conductive portions of various layers of the substrates 102, 103 to other electrically conductive portions of the substrates 102, 103. Electrically conductive plating material 108 (e.g., copper) covers the interior surface of each via 105.

Figure 2:
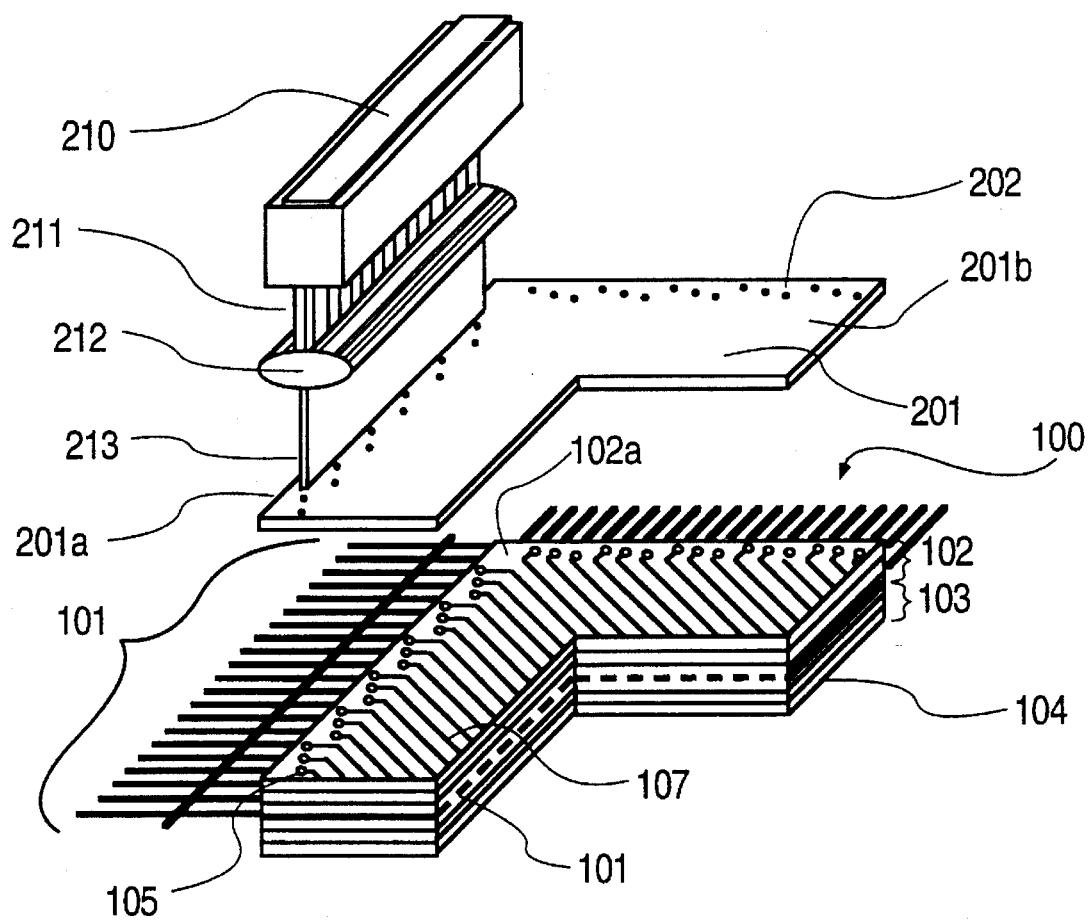
FIG. 2 is a cutaway view of a lead and multilayer substrate combination in which vias are formed through the substrate layers by using a mask imaging technique.

FIG. 2 illustrates one method, the mask imaging technique, according to the invention for forming vias 105 in the substrates 102, 103 of the lead and multilayer substrate combination 100. The method will be described only with respect to formation of vias such as via 105 between the substrate 102 and lead 101; however, it is understood that the same method is used to form vias in substrate 103. A mask 201 is patterned so that holes 202 are formed at locations at which it is desired to form vias 105 in the substrate 102. (At this stage, of course, the vias 105, though shown in FIG. 2, do not exist in the substrate 102. Additionally, the conductive traces 107 also do not exist at this stage; however, they are shown to illustrate that the vias 105 are formed at particular locations so as to connect conductive circuitry on the surface 102a to leads 101.) The mask 201 is held in place (by any of a number of well known mechanisms not shown in FIG. 2) over the top surface 102a of the substrate 102.

A laser energy source 210 emits laser energy 211 that is focused by lens 212 into a sheet-shaped laser beam 213. Beginning at one side 201a of the mask 201 outside the periphery of the substrate 102, the laser beam 213 is passed over the entire surface 201b of the mask 201 until the beam 213 reaches; a location beyond the side of the mask opposite side 201a. As the laser beam 213 is swept over the mask surface 201b, the laser beam 213 is allowed to pass through the holes 202. The laser energy (not shown) passing through the holes 202 strikes the substrate surface 102a and cuts through the layers, e.g., layer 110, of the substrate 102 until it reaches the leads 101. The laser is tuned to a frequency which ensures that the substrate material in the to-be-formed via is ablatively removed. However, the mask is of a material (such as copper) to which the laser is not tuned so that the mask is not ablatively affected by the laser.

The laser energy only cuts through the layers, e.g., layer 110; it does not cut through the leads 101. Further, the laser energy only cuts through dielectric material in the layers, e.g., layer 110 (i.e., dielectric layers and dielectric portions of the conductive layers). Thus, where a metal portion of the conductive layers is present in the path of laser energy passing through a hole 202, the laser energy will not cut through that metal portion and the via 105 cut in the substrate 102 extends only to the metal portion rather than all the way to a lead 101.

The laser energy is allowed to penetrate through the dielectric layers and the dielectric portions of the conductive layers of the substrate 102, but prevented from penetrating through the leads 101 or metal portions of the conductive layers, by controlling the fluence of the laser. Fluence represents a combination of the duration of time for which the laser energy is applied and the intensity of the laser during the period of application. Since the metallic material of the leads 101 and metal portions of the conductive layers are much denser than the dielectric material of the substrate layers, e.g., layer 110, the fluence may be controlled so that the laser 210 operates at a sufficiently great strength for a sufficiently long time to penetrate the substrate 102, but not the leads 101 or metal portions of the conductive layers.

After formation of the vias 105, the laser energy source 210 and mask 201 are removed. Conductive circuitry may then be formed on the top surface 102a of the substrate 102 by use of either additive or subtractive process techniques, or combinations thereof.

The mask imaging technique has an advantage over the other techniques to be discussed later in that by changing the position of the mask 201 with respect to the substrate surface 102a, the laser energy passing through the holes 202 and/or the focus of the laser beam may be modified so that larger or smaller diameter vias 105 are formed. This technique also allows the mask 201 to be reused so that it can be used to form vias 105 through a number of substrates 102.

Figure 3:
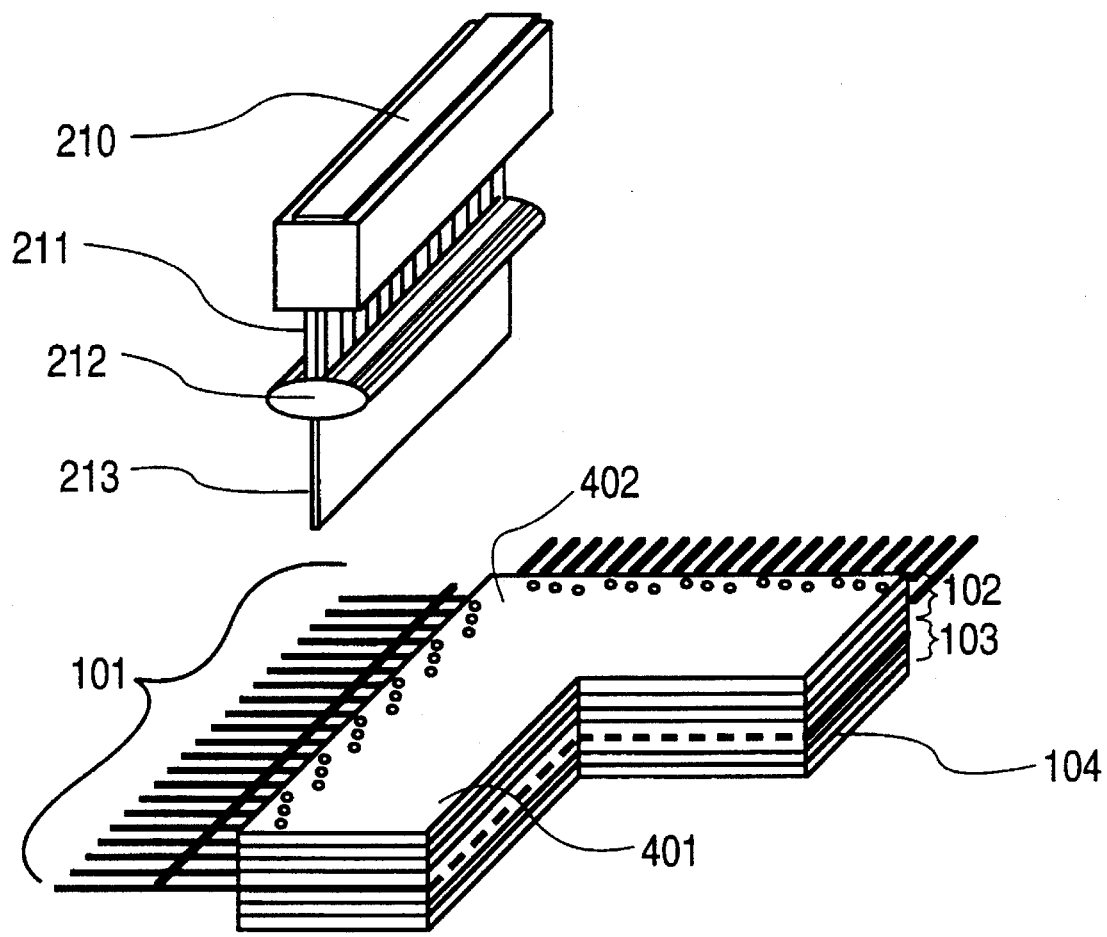
FIG. 3 is a cutaway view of a lead and multilayer substrate combination in which vias are formed through the substrate layers by using a contact mask technique.

FIG. 3 illustrates another method, the contact mask technique, according to the invention for forming vias 105 (not visible in the figure, see FIG. 1 or FIG. 2) in the substrate 102 of the lead and multilayer substrate combination 100. A contact mask 301 is attached directly, or in close proximity, to the top surface 102a (not visible in FIG. 3) of the substrate 102. As with the mask imaging technique, holes 302 are formed in the mask 301 at locations at which it is desired to form vias 105. The mask 301 is held in place and a laser sheet 213 is swept across the mask 301, as previously described, forming holes 105 in the substrate 102. Once again, the laser only cuts through the substrate layers, e.g., layer 110, and not the leads 101. As with the mask imaging technique, after formation of the vias 105, conductive circuitry may then be formed on the top surface 102a of the substrate 102 by use of additive process techniques.

As with the mask imaging technique, in the contact mask technique, the mask 301 may be transferred from lead and multilayer substrate combination 100 to other such combinations 100 during the production process so that the mask 301 may be used to form vias 105 in a number of substrates 102. Thus, there is no need to repetitively form masks 301 on each substrate 102 in which vias are to be formed, as is the case with the conformal mask technique discussed below. The primary difficulty associated with the contact mask technique is in keeping the mask 301 in close contact with the substrate surface 102a while applying the laser energy.

Figure 4:
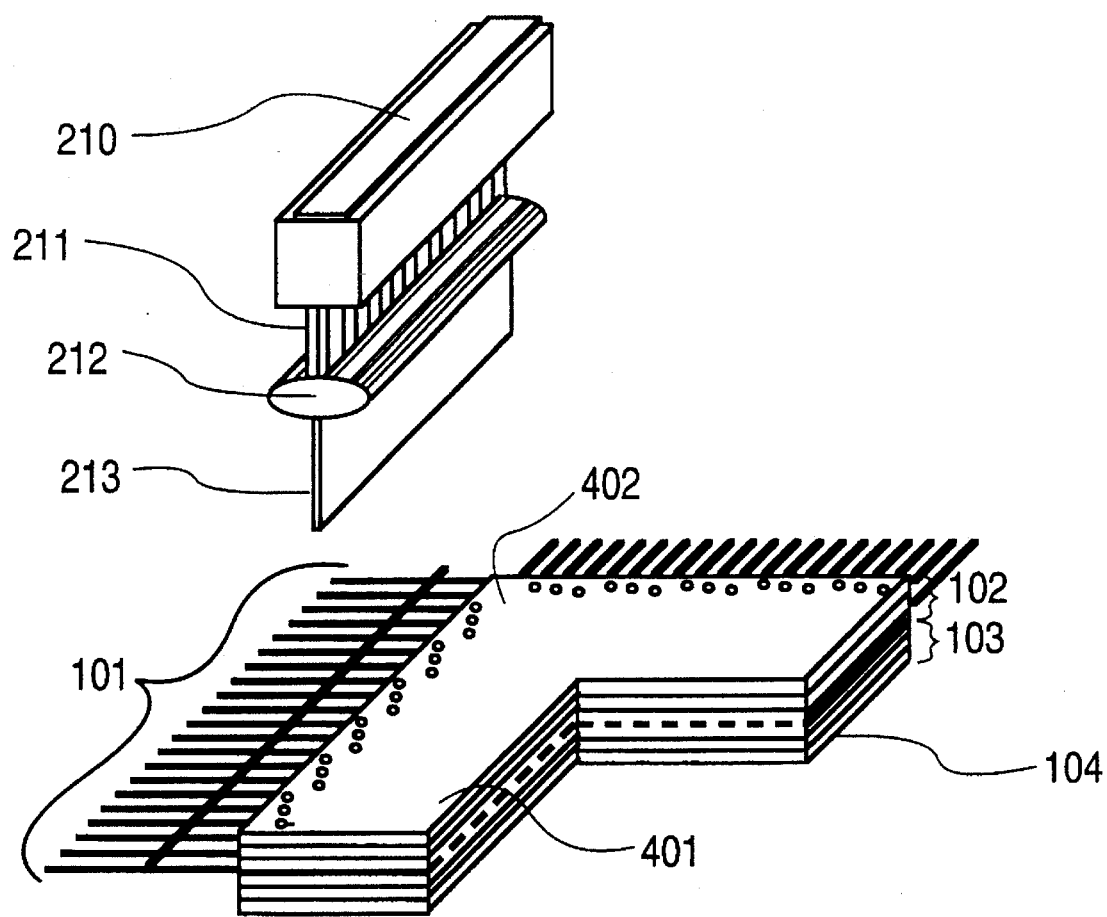
FIG. 4 is a cutaway view of a lead and multilayer substrate combination in which vias are formed through the substrate layers by using a conformal mask technique.

FIG. 4 illustrates another method, the conformal mask technique, for forming vias 105 in a lead and multilayer substrate combination 100. Unlike either the mask imaging or contact mask techniques, the mask 401 in the conformal mask technique is not a separate tooling fixture, but rather is formed as part of the substrate 102. Herein, contact mask will refer to masks 301 that are held in place against the surface 102a of the substrate 102 by mechanical pressure, and conformal mask will refer to masks 401 that are attached to, or formed in, the surface 102a of the substrate 102.

The conformal mask 401 may be formed by bonding a metallic material to the substrate 102. After the mask 401 is deposited on the substrate surface 102a, the mask 401 is patterned using well-known photolithographic techniques to form holes 402 in the mask 401.

Once the vias 105 are formed, the conformal mask 401 may either be removed or left on the substrate surface 102a. The conformal mask 401 may be left on if the mask 401 is made of a conductive material which, after the formation of vias 105, may be patterned to produce conductive circuitry. Thus, the conformal mask technique is preferred over the other two techniques because of the ability to use the mask 401 already formed on the substrate 102 to produce the desired electronic circuitry that would otherwise be formed on substrate 102a.

In the techniques described above, mask 201, 301 or 401 is formed and used in conjunction with a laser sheet 213 to form vias 105 in a substrate, e.g., substrate 102, attached to one side of a set of leads 101. The laser energy source 210 is set at an appropriate level of fluence (determined by the particular characteristics of the materials used to form the substrate 102) so that the laser energy penetrates substrate 102, but does not penetrate the leads 101. Since the laser sheet 213 is swept across a number of holes 202, 302 or 402 in the mask 201, 301 or 401 at the same time, a large number of vias 105 can be formed in the substrate 102 quickly. In contrast, the use of a point-shaped laser beam to form single vias 105, means that only one via 105 can be formed at a time. Further, the laser energy source 210 must be repositioned with great accuracy before forming each via 105. Thus, forming vias 105 by sweeping a sheet-shaped laser beam 213 is much faster than previous methods in which vias 105 were formed one at a time by a point-shaped laser beam.

As shown in FIGS. 2–4, substrates 102, 103 are attached to opposite sides of the set of leads 101. Formation of vias 105 in the substrate 103 is done in the same manner as described for substrate 102. Vias 105 may be formed in the substrates 102,103 either sequentially (in which case only one mask is required, though two could be used if production considerations make that desirable) or simultaneously (in which case two masks are required). If two masks (top and bottom) are used, proper alignment of the masks is achieved through well known registration techniques. Further, though vias 105 have been formed after the substrates 102, 103 are attached to the set of leads 101 in the embodiments so far discussed, the vias 105 could, alternatively, be formed prior to attachment of the substrates 102, 103 to the set of leads 101.

Alternatively, other methods of via formation could be used to make an integrated circuit package according to the invention which includes a multilayered substrate in which interconnecting vias are formed. These include etching or chemical milling, as well as pre-drilling of vias prior to lamination of the substrate to the package leads.

Figure 5:
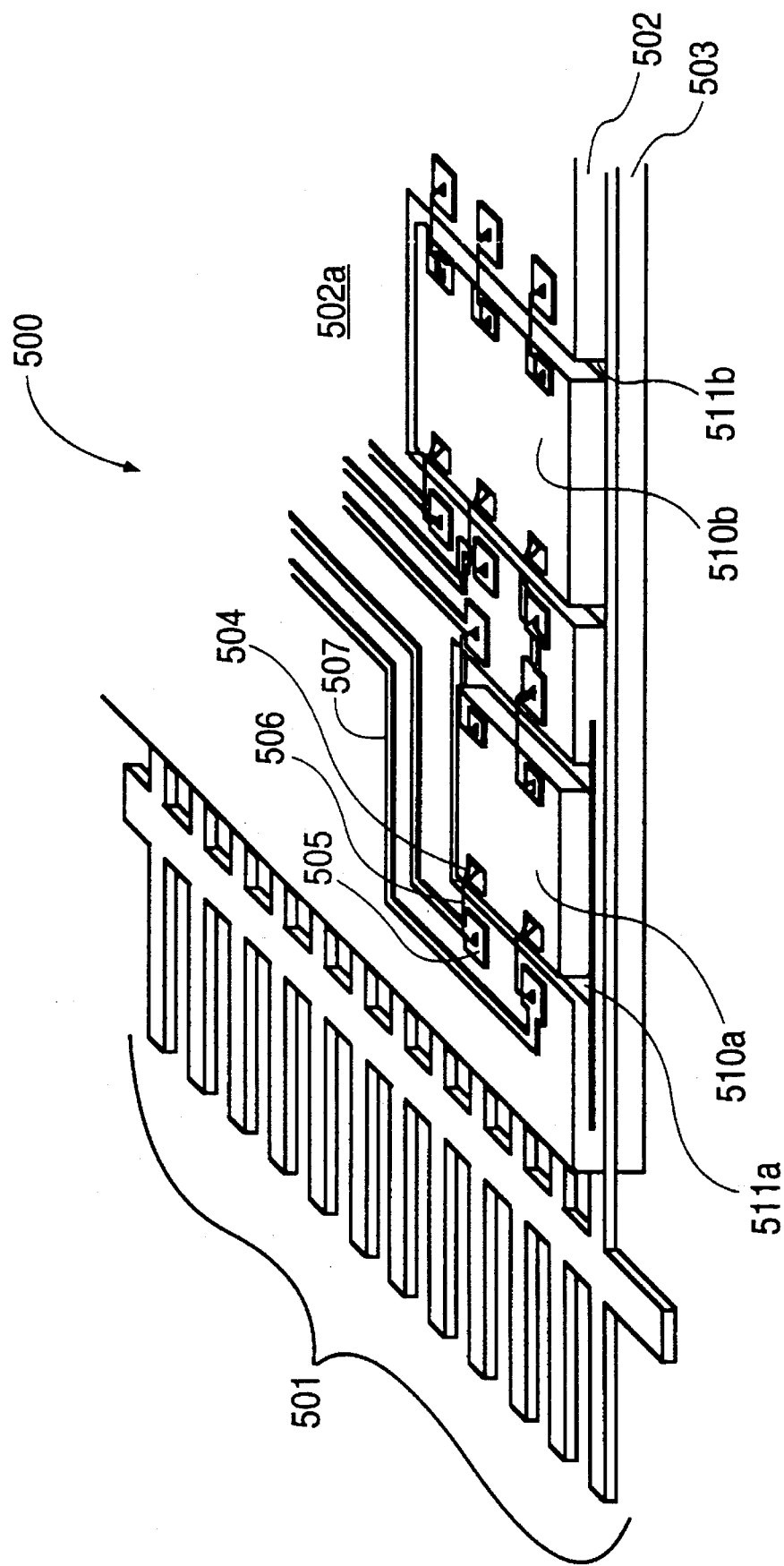
FIG. 5 is a perspective view of another embodiment of the invention in which integrated circuit chips are disposed within cavities formed in the substrate of a lead and substrate combination.

FIG. 5 shows another embodiment of the invention in which integrated circuit chips 510a, 510b are disposed within cavities 511a, 511b, respectively, formed in the substrate 502 of a lead and substrate combination 500. Such an arrangement may be desirable as a means to supply ground and power plane voltages, provide heat dissipation from the chip, decrease the package profile, allow tighter grouping of integrated circuit chips and other components, or reduce the signal transmission length from the integrated circuit. The integrated circuit chips 510a, 510b are attached to the substrate 502. Electrical connection from the integrated circuit chips 510a, 510b to conductive traces 507 formed on the surface 502a of the substrate 502 is made by bond wires 506 connected between bond pads 504 formed on the integrated circuit chips 510a, 510b and bond pads 505 formed on the surface 502a. The chip may be formed with a conductive underside that is electrically connected to a conductive cavity floor.

The cavities 511a, 511b are formed by any of the methods described with respect to FIGS. 2–4. To form the cavities 511a, 511b, the mask 201, 301 or 401 is patterned with larger openings 202, 302 or 402 than used to form vias 105. The use of a laser is preferable to accomplish this cavity formation because it overcomes the tolerance problems (e.g., cavity depth, corner radius, X-Y tolerance, damage to adjacent areas) associated with the previously used mechanical milling approach.

Figure 6A:
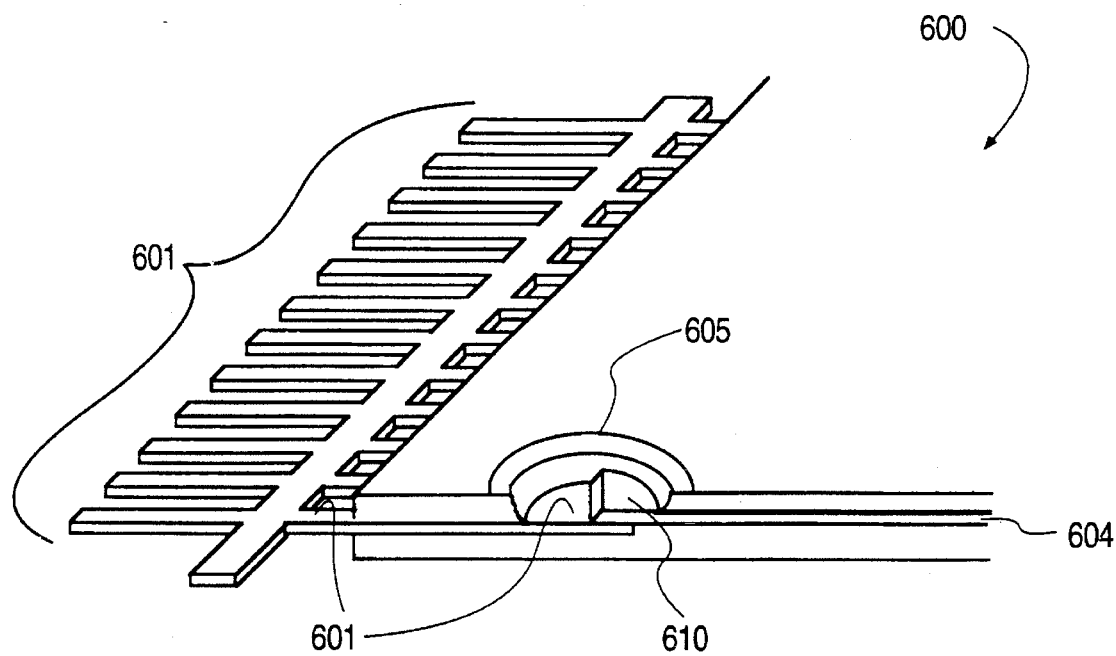
FIGS. 6A, 6B and 6C are perspective, top and side views of another embodiment of the invention in which the electrical connection between a lead and an electrically conductive portion of an inner substrate layer of a lead and multilayer substrate combination is made through the formation of a single via.
Figure 6B:
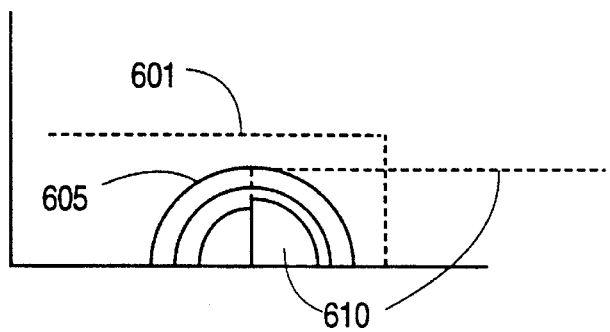
Figure 6C:
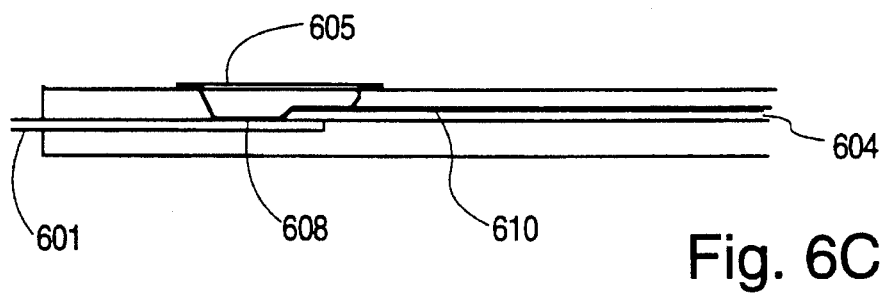

FIGS. 6A, 6B and 6C show another embodiment of the invention in which the electrical connection between a lead 601a of the set of leads 601 and an electrically conductive portion 610 of an inner substrate layer 604 of a lead and multilayer substrate combination 600 is made through the formation of a single via 605, rather than two vias as shown by vias 105a and 105d in FIG. 1. Electrically conductive plating material 608 connects the lead 601a to the portion 610. The via 605 is formed by any of the methods described above with respect to FIGS. 2–4. The hole 202, 302 or 402 in the mask 201, 301 or 401 required to form the via 605 is somewhat larger than that used to form the vias 105.

Figure 7:
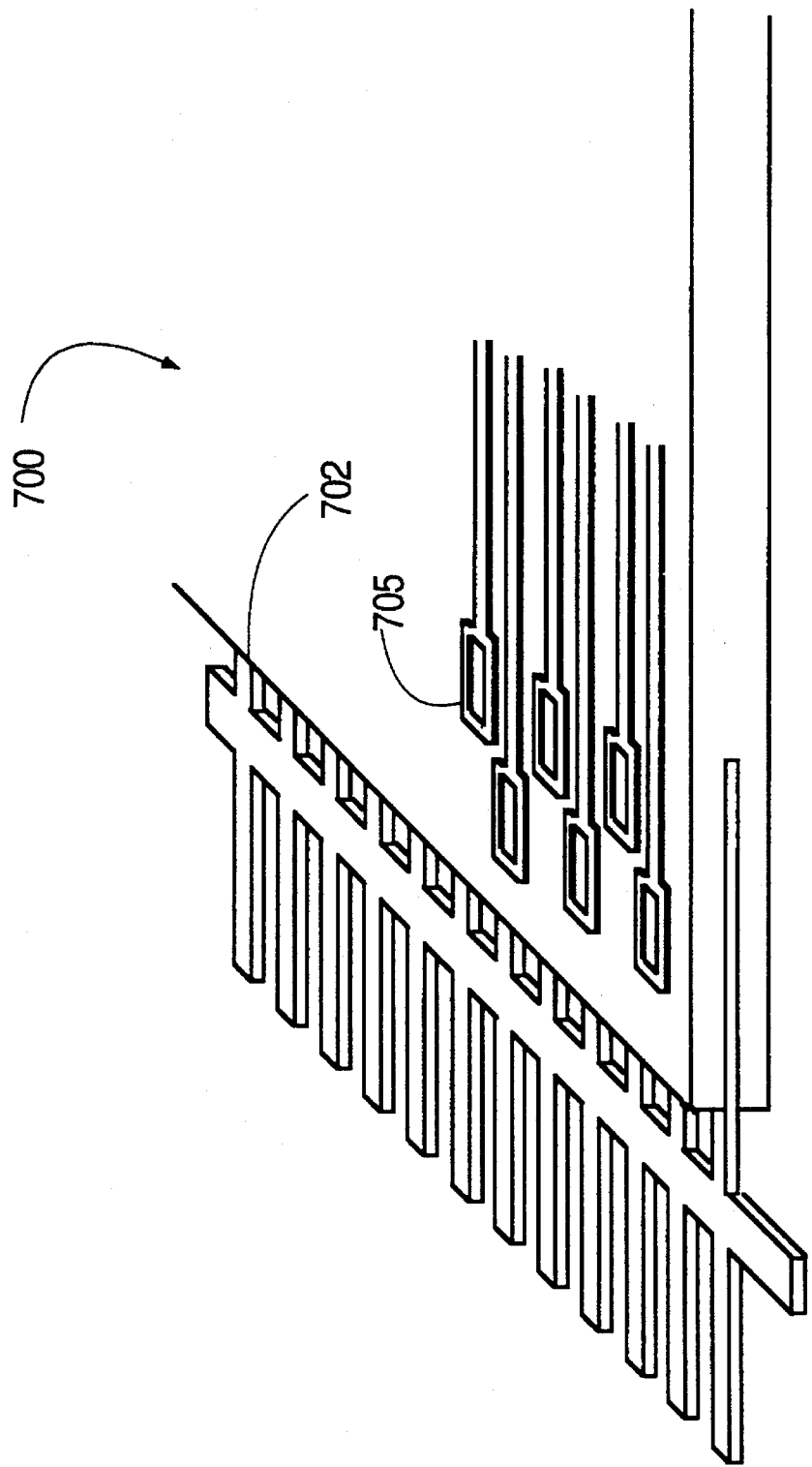
FIG. 7 is a perspective view of a lead and multilayer substrate combination according to another embodiment of the invention in which the vias have an elongated cross-sectional shape.

FIG. 7 shows a lead and multilayer substrate combination 700 according to another embodiment of the invention. This embodiment is similar to that shown in FIG. 1, except that the vias 705 have an elongated cross-sectional shape in contrast to the circular shape of the vias 105 shown in FIG. 1. The vias 705 may be formed by any of the methods of FIGS. 2–4 with proper adjustment of the shape of the holes 202, 302 or 402 in the mask 201, 301 or 401.

The electrical resistance and inductance of a via is reduced, and the reliability of the electrical interconnection increased, as the amount of surface area of the via increases. Since the via 705 may have the same surface area while presenting a thinner dimension in the direction along the side of the substrate 702, the via 705 has an advantage over the via 105 in that it provides the same resistance, inductance and reliability characteristics as the via 105 while allowing denser placement of the vias 705. Alternatively, for the same interconnection density, via 705 has superior resistance, inductance and reliability characteristics in comparison to via 105.

Preferably, organic materials (e.g., thermosetting or thermoplastic resins.) with organic fiber reinforcement (e.g., aramid fibers) are used to form the dielectric layers of the substrate 102. One reason for this preference is that organic substrates are less expensive than inorganic substrates (e.g., glass or ceramic). A second reason is that organic materials may be penetrated with a laser more easily and quickly than inorganic materials. Finally, organic materials have better dielectric properties than inorganic materials.

As previously discussed, thermal lasers have been used to form vias in a substrate. However, when the dielectric layers are formed of organic materials, the use of a thermal laser produces undesirable side effects such as dielectric degradation, charring and surface reflow. Because of these problems, it has been necessary either to use the more expensive ceramic or glass substrate if use of a thermal laser is contemplated, or perform mechanical drilling if it is desired to use an organic substrate.

In an embodiment according to the invention, the dielectric portions of the substrate are formed of organic material. Vias are formed in the substrate using a non-thermal laser (e.g., an excimer laser), thus avoiding the detrimental effects associated with the use of thermal lasers or mechanical drills.

Any organic material, such as a thermosetting resin or thermoplastic resin, may be used to form the non-conductive portions of the substrate. The thermosetting resins are preferably chosen from the following group: epoxy, polyimide, polyamide, polyetherimide or polycyanurate. The thermoplastic resins are preferably chosen from the following group: polyester, polyamide, polysulfone, polyetherimide, polycarbonate. Epoxy resin is most desirable because of its low cost, its ready availability and wide knowledge of its properties. Preferably, an epoxy resin having high temperature resistance is used so that high hole quality is maintained. Resins with low ionic content (i.e., low impurity levels) are also preferable to avoid corrosion of semiconductor chips and electromigration.

Organic fiber reinforcement may also be used in the organic resin. Fibers that may be used include: aramid polyester, polyamide, poly-ether-ether-ketone, polyimide, polyetherimide, or polysulfone. The fibers may include a portion of inorganic fillers as long as the fillers do not impede penetration by the laser. Preferably, aramid fibers are used, such as poly-(paraphenylene terephthalamide) and co-poly-(paraphenylene/3,4'-diphenylether terephenylether terephthalamide), since they are easily fabricated into printed circuit boards. In particular, the latter fiber has higher purity in terms of ionic content.

The fiber reinforcement can be woven fabric, non-woven fabric or paper. Paper reinforcements may be preferable due to their flat surface which allows easy mounting of semiconductor chips.

The organic substrate may be a laminate, a board, or a resin coating on the set of leads. If the substrate is formed by a resin coating, a circuit may be subsequently formed on the resin. Boards or laminates may either be etched prior to attachment to the set of leads, or attached to the set of leads and then etched. The boards or laminates may be attached to the set of leads either by an adhesive or by laminating with prepreg (i.e., B-stage epoxy) and press curing.

The top layer of the substrate is patterned and etched to form a printed circuit board. This may be done either before or after the substrate is constructed as discussed above. If the conformal mask technique is used, the mask may be left in place after formation of the vias and the printed circuit board formed on the exposed surface of the mask. Interconnection of the package leads to individual semiconductor chips and other discrete components may be achieved through the use of wire bonding, tape automated bonding (TAB), flip-chip, or other bonding technologies.

After the substrate is mounted on the set of leads, the vias formed, the conductive plating deposited, the outer layers patterned, and the integrated circuit chips and/or other components attached and electrically connected as previously described, the apparatus is then encapsulated in a molding resin (e.g., epoxy, polyimide, poly-bismaleimide) to form a completed integrated circuit package. In the completed package, the outer ends of the leads remain exposed outside the encapsulant to allow electrical connection with other electrical components.

To illustrate the above descriptions of the invention, two examples will be presented of desirable embodiments of the invention.

In the first example, a resin containing an aramid fiber formed of co-poly-(paraphenylene/3,4'-diphenylether terephthalamide), having a diameter of 12 microns and a length of 3 mm, is sheet-formed using a paper machine. The resin contains 15% organic binder from water-soluble epoxy. The basis weight of the paper is 72 g/m$^2$. The paper is impregnated with an epoxy resin including a hardener of Novolac type resin to form a prepreg. The fiber content of the prepreg is 45% by weight. The prepreg is laminated to form a sheet having a thickness of 0.1 mm. Details of the preparation are described in Japanese Open Patent 1-281791.

Copper foils having a thickness of 18 microns are laminated to both sides of the prepreg using an epoxy adhesive. The total thickness of the insulation layer (including the epoxy adhesive layer) is typically 0.10–0.15 mm. Vias are formed with a Kr/F excimer laser (e.g., Lambda Physik type LPX 100) and plated with copper to establish inner layer connections. The laser has a wavelength of 248 nm. The pulse frequency of the laser beam is 200 Hz and the pulse energy is 1.6 J/cm$^2$. The holes are subjected to an ablation of 7 seconds. Alternatively, through holes may be drilled and plated.

The copper foil surfaces are then patterned to form conductive circuitry on one side and rows of holes on the other. Next, the substrate (copper foil, adhesive, prepreg) is bonded to the leads of a leadframe using an epoxy adhesive so that the copper foil side on which conductive circuitry is formed faces the leadframe. A row of vias is formed through the holes in the copper with a Kr/F excimer laser (as before) so that the vias extend through the insulation layer to the leads. The vias are plated with copper using a conventional electroless plating and/or electroplating process. The thickness of the plated copper is 15 microns. The exposed surface of the copper foil is then patterned to complete the layered circuits.

An integrated circuit chip is adhesively attached to the leadframe and substrate assembly. The integrated circuit chip is electrically connected to conductive circuitry formed on the substrate by conventional wire bonding techniques. The leadframe and substrate assembly with integrated circuit chips mounted is encapsulated in a plastic to form the body of the package. The outer leads are plated, then the outer ring of the leadframe is trimmed off and lead ends formed as desired.

In the second example, the copper-clad laminate as described in the first example is manufactured. Two sheets of prepreg having a thickness of 0.1 mm are put on each side of the patterned laminate. A copper foil having a thickness of 18 microns is attached to one sheet of prepreg. Vias or through holes are formed and plated with copper to establish inner layer connections. The inner copper foil surfaces are patterned to form circuitry and rows of holes are formed on the outside copper layer. This process is repeated for a second substrate, creating another multilayer structure. The leads of a leadframe are then bonded between the two substrates with additional sheets of prepreg separating layers. This structure is press-cured at 200° C. for 45 minutes at a pressure of 40 kg/cm$^2$.

Rows of vias are formed with a Kr/F excimer laser through the holes exposed in the surface of the copper foil. The vias have a diameter of 0.2 mm. The laser energy has a wavelength of 248 nm, a pulse frequency of 200 Hz and an energy level of 1.6 J/cm square. The laser energy is applied for 15 seconds. After the vias are formed, they are plated with copper using a conventional electroless plating and/or electroplating process. The thickness of the plated copper is 15 microns.

The copper foil is then patterned to form circuitry and wire bond pads. Four integrated circuit chips are mounted on the etched portions of the copper foil and bonded to the pads with wire. The entire device is then encapsulated with an epoxy compound. The outer leads are plated and trimmed to form the finished package. The package has a length of 28 mm on each side and 352 leads extending from the package.

Various embodiments of the invention have been described. The descriptions are intended to be illustrative, not limitative. Thus, it will be apparent to one skilled in the art that certain modifications may be made to the invention as described without departing from the scope of the claims set out below.

We claim:

1. An encapsulated integrated circuit, comprising:
   a substrate having a first surface and a second surface opposite the first surface and including a dielectric layer;
   a plurality of electrically conductive vias in the substrate;
   a plurality of electrically conductive leads attached to the first surface of the substrate;
   a plurality of bond pads, on the second surface of the substrate, for connection to an integrated circuit;
   a plurality of electrically conductive traces extending on the second surface from the bond pads;
   one of the electrically conductive vias extending from one of the traces through the dielectric layers to one of the plurality of leads; and
   a plastic material encapsulating the substrate and an inner portion of the leads with an outer portion of the leads remaining exposed outside the plastic material.

2. An encapsulated integrated circuit as in claim 1, wherein the substrate further includes at least one interior layer, each interior layer comprising a dielectric layer and an interior generally conductive layer, each interior generally conductive layer having conductive paths, and wherein one of the vias extends from one of the traces to one of the conductive paths and to one of the leads.

3. An encapsulated integrated circuit as in claim 2, wherein at least one of the electrically conductive vias extends from a first interior generally conductive layer to a second interior generally conductive layer.

4. An encapsulated integrated circuit as in claim 1, wherein the vias have an elongated cross-sectional shape in a plane approximately parallel to the first surface of the substrate, the longest dimension of the cross-sectional shape aligned perpendicular to a side of the substrate.

5. A packaged integrated circuit, comprising:
   a substrate having a first surface and a second surface opposite the first surface and including a dielectric layer comprising an organic material;
   a plurality of electrically conductive vias in the substrate;
   a plurality of electrically conductive leads attached to the first surface of the substrate;
   a plurality of bond pads, on the second surface of the substrate, for connection to an integrated circuit;
   a plurality of electrically conductive traces extending on the second surface from the bond pads;
   one of the electrically conductive vias extending from one of the traces through the dielectric layer to one of the plurality of leads.

6. A packaged integrated circuit as in claim 5, wherein the substrate further includes at least one interior layer, each interior layer comprising a dielectric layer and an interior generally conductive layer, each interior generally conductive layer having conductive paths, and wherein one of the vias extends from one of the traces to one of the conductive paths and to one of the leads.

7. A packaged integrated circuit as in claim 6, wherein at least one of the electrically conductive vias extends from a first interior generally conductive layer to a second interior generally conductive layer.

8. A packaged integrated circuit as in claim 5, wherein the vias have an elongated cross-sectional shape in a plane approximately parallel to the first surface of the substrate, the longest dimension of the cross-sectional shape aligned perpendicular to a side of the substrate.

9. A packaged integrated circuit, comprising:
   a substrate including a dielectric layer and a cavity formed in a first surface of the substrate at a desired location;
   an integrated circuit having a first surface on which electrically conductive circuitry and a plurality of bond pads are formed, and a second surface opposite the first surface that is attached to the substrate within the cavity;
   bond pads on the first surface of the substrate;
   conductive traces on the first surface of the substrate extending from the bond pads;
   leads attached to a second surface of the substrate opposite the first surface of the substrate;
   electrical connections from the bond pads on the integrated circuit to the bond pads on the substrate; and
   vias extending from the traces to the leads.

10. A packaged integrated circuit, comprising:
    a substrate having an integrated circuit attach surface and including an inner layer comprised of a generally conductive layer and a dielectric layer, a plurality of electrically conductive vias being formed in the substrate;
    a plurality of electrically conductive leads, an inner portion of each of the plurality of electrically conductive leads attached to a lead attach surface of the substrate such that the inner portion of the leads is substantially parallel to the plane of the lead attach surface, one of the vias extending from the integrated circuit attach surface of the substrate to a lead and electrically connecting said lead to a conductive portion of the generally conductive layer;

an integrated circuit having a first surface and a second surface opposite the first surface, the first surface of the integrated circuit being attached to the integrated circuit attach surface of the substrate, circuitry and a plurality of bond pads being formed on the second surface of the integrated circuit;

a plurality of bond pads on the integrated circuit attach surface of the substrate;

a plurality of traces on the integrated circuit attach surface of the substrate connecting the bond pads on the integrated circuit attach surface of the substrate to the vias;

means for electrically connecting one of the bond pads of the integrated circuit to one of the bond pads on the integrated circuit attach surface of the substrate, the bond pad on the substrate being electrically connected by one of the traces to said via; and a plastic material encapsulating the substrate and the inner portion of the leads such that an outer portion of the leads remains exposed outside the plastic material.

11. A packaged integrated circuit as in claim 10, further comprising a second substrate including at least one composite layer comprised of a generally conductive layer and a dielectric layer, a plurality of electrically conductive vias being formed in the second substrate, the inner portions of the leads being attached to a lead attach surface of the second substrate such that: the inner portions of the leads are between the first and second substrates, at least one of the vias in the second substrate electrically connecting a lead to electrically conductive material formed on the generally conductive layer of the second substrate.

* * * * *